United States Patent
Yonar et al.

(10) Patent No.: US 12,088,316 B2
(45) Date of Patent: *Sep. 10, 2024

(54) SUCCESSIVE-APPROXIMATION ANALOG-TO-DIGITAL CONVERTERS

(71) Applicant: INTERNATIONAL BUSINESS MACHINES CORPORATION, Armonk, NY (US)

(72) Inventors: Abdullah Serdar Yonar, Zurich (CH); Pier Andrea Francese, Adliswil (CH); Marcel A. Kossel, Reichenburg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,338

(22) Filed: Apr. 24, 2023

(65) Prior Publication Data

US 2023/0261665 A1 Aug. 17, 2023

Related U.S. Application Data (63) Continuation of application No. 17/354,421, filed on Jun. 22, 2021, now Pat. No. 11,652,493.

(51) Int. Cl.
*H03M 1/12* (2006.01)
*H03M 1/10* (2006.01)
*H03M 1/46* (2006.01)

(52) U.S. Cl.
CPC ......... *H03M 1/125* (2013.01); *H03M 1/1009* (2013.01); *H03M 1/462* (2013.01)

(58) Field of Classification Search
CPC ..... H03M 1/125; H03M 1/1009; H03M 1/462
(Continued)

(56) References Cited

U.S. PATENT DOCUMENTS

| | | | |
|---|---|---|---|
| 8,344,925 B1 * | 1/2013 | Evans | H03M 1/462 |
| | | | 341/120 |
| 9,614,540 B1 * | 4/2017 | Kull | H03M 1/0607 |

(Continued)

FOREIGN PATENT DOCUMENTS

| | | |
|---|---|---|
| CN | 104253613 A | 12/2014 |
| CN | 106656190 A | 5/2017 |

(Continued)

OTHER PUBLICATIONS

Lin He et al., "A Speed Enhancing Dual Trial Instantaneous Switching Architecture for SAR ADCs," IEEE Transactions on Circuits and Systems II: Express Briefs, Oct. 14, 2014, 6 pages, https://ieeexplore.ieee.org/document/6922504.

(Continued)

*Primary Examiner* — Khai M Nguyen
(74) *Attorney, Agent, or Firm* — Peter J. Edwards (57) ABSTRACT

A successive-approximation analog-to-digital converter includes a sampling circuit for sampling an analog input signal to acquire a sampled voltage, and a regenerative comparator for comparing the sampled voltage with a succession of reference voltages to generate, for each reference voltage, a decision bit indicating the comparison result. The converter also includes a digital-to-analog converter which is adapted to generate the succession of reference voltages, in dependence on successive comparison results in the comparator, to progressively approximate the sampled voltage. The regenerative comparator comprises an integration circuit for generating output signals defining the decision bits, and a plurality of regeneration circuits for receiving these output signals. The regeneration circuits are operable, in response to respective control signals, to store respective decision bits defined by successive output signals from the integration circuit.

20 Claims, 6 Drawing Sheets

(58) Field of Classification Search
USPC .......................................... 341/155, 163, 172
See application file for complete search history.

(56) References Cited

U.S. PATENT DOCUMENTS

| | | |
|---|---|---|
| 10,693,486 B1* | 6/2020 | Ko .................. H03K 5/2481 |
| 2009/0102694 A1 | 4/2009 | Nittala et al. |
| 2010/0109924 A1 | 5/2010 | Cho et al. |
| 2011/0057823 A1 | 3/2011 | Harpe |
| 2013/0038483 A1 | 2/2013 | Liu et al. |
| 2014/0070968 A1 | 3/2014 | Janakiraman et al. |
| 2019/0190531 A1 | 6/2019 | Martens et al. |

FOREIGN PATENT DOCUMENTS

| | | |
|---|---|---|
| CN | 110311680 A | 10/2019 |
| CN | 112688688 A | 4/2021 |
| WO | 2022269403 A1 | 12/2022 |

OTHER PUBLICATIONS

Tao Fu, "High-Speed Successive Approximation Register (SAR) ADC Design with Multiple Concurrent Comparators," SMU Scholar, Electrical Engineering Thesis and Dissertations, Southern Methodist University, Winter 2019, 65 pages, https://scholar.smu.edu/engineering_electrical_etds/28/.

Ragab et al., "A 1.4mW 8b 350MS/s Loop-Unrolled SAR ADC with Background Offset Calibration in 40nm CMOS," IEEE, ESSCIRC Conference 2016: 42nd European Solid-State Circuits Conference, Sep. 12, 2016, 4 pages.

Wei et al., "An 8-b 400-MS/s 2-b-Per-Cycle SAR ADC With Resistive DAC," IEEE Journal of Solid-State Circuits, vol. 47, No. 11, Nov. 2012, 10 pages.

Cao et al., "A 32mW 1.25GS/s 6b 2b/step SAR ADC in 0.13 μm CMOS," ISSCC 2008 / Session 30 / Data-Converter Techniques / 30.2, Mar. 2009, 3 pages.

Schinkel et al., "A Double-Tail Latch-Type Voltage Sense Amplifier with 18ps Setup+Hold Time," ISSCC 2007 / Session 17 / Analog Techniques and PLLs /173, Feb. 11, 2007, 3 pages.

Lien, "A 4.5-mW 8-b 750-MS/s 2-b/Step Asynchronous Subranged SAR ADC in 28-nm CMOS Technology," IEEE, 2012 Symposium on VLSI Circuits Digest of Technical Papers, Jun. 2012, 2 pages.

Liu et al., "A 6-bit 220-MS/s Time-Interleaving SAR ADC in 0.18-μm Digital CMOS Process," IEEE, Apr. 2009, 4 pages.

MccCreary et al., "WAM 3.1 : A High-speed, All-MOS Successive-Approximation Weighted Capacitor A/D Conversion Technique," 1975 IEEE International Solid-State Circuits Conference, Session III: A/D and D/A Techniques, Feb. 12, 1975, 3 pages.

Chun-Cheng Liu, et al, "A 10b 100MS/s 1.13mW SAR ADC with binary-scaled error compensation," 2010 IEEE International Solid-State Circuits Conference—(ISSCC), Feb. 7, 2010, 3 pages.

Sebastian et al., "Memory devices and applications for in-memory computing," Nature Nanotechnology, vol. 15, Jul. 2020, pp. 529-544, http://www.nature.com/naturenanotechnology.

Liu et al., "Analysis and Background Self-Calibration of Comparator Offset in Loop-Unrolled SAR ADCs," IEEE, Transactions on Circuits and Systems I: Regular Papers, vol. 65, No. 2, pp. 458-470, Feb. 2018, doi: 10.1109/TCSI.2017.2723799.

Abdullah Serdar Yonar, et al., "Successive-Approximation Analog-to-Digital Converters," U.S. Appl. No. 17/342,421, filed Jun. 22, 2021.

List of IBM Patents or Patent Applications Treated as Related, Dated Apr. 21, 2023, 2 pages.

International Search Report for PCT/IB2022/055377, dated Jun. 22, 2021, 7 pages.

Stepanovic et al., "A 2.8 GS/s 44.6 mW Time-Interleaved ADC Achieving 50.9 dB SNDR and 3 dB Effective Resolution Bandwidth of 1.5 GHz in 65 nm CMOS," IEEE Journal of Solid-State Circuits, vol. 48, No. 4, Apr. 2013, pp. 971-982.

* cited by examiner

FIG. 6

SUCCESSIVE-APPROXIMATION ANALOG-TO-DIGITAL CONVERTERS

BACKGROUND

The present invention relates generally to successive-approximation analog-to-digital converters (SAR ADCs). SAR ADCs are provided together with apparatus incorporating these converters.

Analog-to-digital converters (ADCs) are well-known devices which repeatedly sample an analog input signal to generate a digital signal representing the analog waveform. SAR ADCs use a binary search algorithm to map a voltage sampled from the analog input signal to a digital representation of the sampled voltage level. The sampled voltage is compared with a succession of reference voltages which follow a binary search through the possible quantization levels to progressively approximate the sampled voltage level.

The vast majority of SAR ADCs use regenerative comparators for comparing the sampled voltage with the reference voltages. These comparators employ two circuits for two respective stages, namely integration and regeneration. The integration stage generates an output signal dependent on the input voltages being compared. When this output signal reaches a sufficient level, the second stage starts regeneration. The regeneration circuit provides the comparator output to subsequent circuitry in the SAR ADC which stores the comparator decisions and controls the binary search process.

SUMMARY

A first aspect of the present invention provides a successive-approximation analog-to-digital converter. The converter includes a sampling circuit configured to sample an analog input signal to acquire a sampled voltage, and a regenerative comparator configured to compare the sampled voltage with a succession of reference voltages and generate, for each reference voltage, a decision bit based on the comparing. The converter further comprises a digital-to-analog converter configured to generate the succession of reference voltages to progressively approximate the sampled voltage, wherein the generating the succession of reference voltages is based on successive comparison results from the comparator. The regenerative comparator comprises an integration circuit configured to generate output signals defining each decision bit, and a plurality of regeneration circuits configured to receive these output signals. The regeneration circuits are also configured to receive control signals and, in response to receiving the control signals, to store decision bits defined by output signals from the integration circuit.

A second aspect of the invention provides an in-memory compute apparatus. The apparatus comprises an array of memory devices, connected between respective pairs of word- and bit-lines of the array, for storing values for a computation in which input signals are supplied to the bit-lines to obtain analog output signals on the word-lines. Each word-line is connected to a successive-approximation analog-to-digital converter (SAR ADC) in accordance with the first aspect of the invention for analog-to-digital conversion of an output signal on that word-line to a digital signal for further processing.

Embodiments of the invention will be described in more detail below, by way of illustrative and non-limiting example, with reference to the accompanying drawings. The above summary is not intended to describe each illustrated embodiment or every implementation of the present disclosure.

DETAILED DESCRIPTION

Aspects of the present disclosure relate to analog-to-digital converters (ADCs). More particular aspects of the present disclosure relate to unrolled-regeneration successive-approximation ADCs (SAR ADCs).

An example conventional SAR ADC may comprise a sampling circuit, a comparator, a digital-to-analog converter (DAC), and SAR logic which includes memory cells for storing the decisions from the comparator. An additional logic block may be included for timing control as explained below. The sampling circuit, which may, for example, comprise a sampling switch $T_s$ and capacitor $C_s$, may sample an input analog waveform to acquire a sampled voltage $V_s$ which is supplied to the comparator. The DAC generates a reference voltage $V_{ref}$ which is also supplied to the comparator. The comparator compares $V_s$ with $V_{ref}$ and provides an output signal indicating the comparison result to the SAR logic. If $V_s \geq V_{ref}$, a decision bit $d_1 = 1$ can be stored in a memory cell of the SAR logic. If $V_s < V_{ref}$, the stored decision bit is $d_1 = 0$. The SAR logic then supplies a control code to the DAC to update the reference voltage $V_{ref}$, and the comparison is repeated to store the next decision bit $d_2$. This process iterates until n decision bits, for an n-bit SAR ADC, have been stored in the SAR logic. The stored decision bits $d_1$ to $d_n$ then provide the SAR ADC output $D_{out}$ which is a digital representation of the sampled voltage $V_s$.

The SAR logic controls the DAC to update the reference voltage $V_{ref}$ for successive decision steps in dependence on the comparison results in comparator. The DAC can be implemented in various ways using switches whose states are controlled by the input code bits from SAR logic. For the first decision step, $V_{ref}$ may be set to a mid-scale voltage $V_{DAC}/2$ (where $V_{DAC}$ is an internal DAC reference voltage). Subsequent reference voltages $V_{ref}$ may follow a binary search through the quantization levels such that successive values of $V_{ref}$ progressively approximate the sampled voltage $V_s$. As an example, a 4-bit SAR ADC in which $V_{DAC} = 4$ volts, with a sampled voltage $V_s = 3.1$ volts, may illustrate how $V_{ref}$ changes with time t over four decision steps, i=1 to 4, of the SAR ADC. For the first decision i=1, the SAR logic may supply control code 1000 to the DAC switches to set $V_{ref}=V_{DAC}/2=2V$. For each subsequent decision i=2 to 4, the DAC control code may be updated in dependence on the decision for the previous step, whereby $V_{ref}$ may be updated to $V_{ref}\pm V_{DAC}/2^i$ in dependence on the previous decision. If $V_s \geq V_{ref}$ in the previous step, $V_{ref}=V_{ref}+V_{DAC}/2^i$. If $V_s<V_{ref}$ in the previous step, then $V_{ref}=V_{ref}-V_{DAC}/2^i$. In this example, the binary search may progress as:

DAC control code 1000, $V_{ref}$=2V, $d_1$=1;
DAC control code 1100, $V_{ref}$=3V, $d_2$=1;
DAC control code 1110, $V_{ref}$=3.5V, $d_3$=0; and
DAC control code 1101, $V_{ref}$=3.25V, $d_4$=0.

It can be seen that the control code sets the $i^{th}$ bit to 1 for each decision step, and then either keeps or resets this bit if $d_i$=1 or 0, respectively. The resulting output code is $D_{out}$=1100.

The comparator may typically be implemented by a regenerative comparator. These comparators offer zero static power dissipation, rail to rail output and a compact design. As an example, a two-stage clocked comparator design with a double tail topology may comprise two stages: an integration stage and a regeneration stage. The integration stage may comprise an integrating preamplifier with a differential configuration. In operation in the example SAR ADC discussed above, the differential input signal DP, DN is defined by the sampled voltage $V_s$ and the reference signal $V_{ref}$ from the DAC. The inputs RP and RN may be used for offset calibration, as described below. The sampled voltage $V_s$ may be applied across DP, DN (i.e., DP−DN=$V_s$). In each decision step, the DAC may update this differential input with the reference signal $V_{ref}$ so that the residue voltage may be available at inputs DP, DN (i.e., DP−DN=$V_s$-$V_{ref}$). The comparator may then decide whether the resulting differential input is positive or negative in each decision step. When the clock signal CKP is applied to connect the comparator to power rail $V_{dd}$, the differential input voltage DN, DP may be converted to differential current which may then be integrated on nodes GP and GN. When the voltage difference between GP and GN reaches the required level, the second stage (which is connected to $V_{dd}$ in response to clock signal CKN) starts regeneration. One of the outputs $V_{op}$ or $V_{on}$ may then regenerate to supply voltage $V_{dd}$ while the other decreases back to ground. Which of outputs $V_{op}$ and $V_{on}$ regenerates depends on whether the differential output signal GP−GN of the preamplifier is positive or negative. This in turn depends on whether DP− DN is positive or negative, and hence which of $V_s$ and $V_{ref}$ is greater. The differential output $V_{op}$-$V_{on}$ may thus indicate the comparison result. During the SAR cycles, the inputs RP and RN are statically set to a calibrated value, which is set only once at the start-up, to cancel any offset due to non-idealities in the comparator circuitry.

SAR ADCs may generally comprise digitally intensive architectures with very few critical analog blocks. However, the sampling speed of SAR ADCs is limited by the feedback loop comprising the comparator, DAC and SAR logic. The feedback delay $T_{fb}$ consists of the clock-to-output delay of the comparator ($T_{ckq}$), the combinational delay of the memory cells and SAR logic ($T_{comb}$), and the DAC settling time ($T_{dac}$):

$$T_{fb}=T_{ckq}+T_{comb}+T_{dac}.$$

The sampling speed can be enhanced by asynchronous internal timing implemented by the logic block described above. In a synchronous architecture, all of the conversion process is synchronized to an external clock. In an asynchronous architecture, the timing logic block provides internally-generated clocks to organize the conversion process so that just enough time is allocated for each comparison to be completed in the binary search process. This offers an important speed advantage and eliminates the need for routing of a high speed clock to control the conversion process, so reducing power consumption. However, the feedback loop is still the main speed-limiting factor since the DAC output has to settle to an accurate value before the next comparison is made.

Various other techniques have been proposed to enhance sampling speed. Set-and-down conversion offers more efficient switching in the DAC. A multi-bit per conversion step strategy can be applied using multiple comparators to take more than one decision in each step. DAC redundancy can be implemented for partial settling of the CDAC, but increases the number of conversion steps for a given resolution. An architecture may also employ separate comparators for each bit decision. Pipelining can also be applied to SAR ADCs so that all of the circuits can operate in parallel. However, all of these techniques have various disadvantages in terms of power and/or area consumption, among others, due to the use of additional DACs or additional comparators and/or other critical analog blocks. While the set-and-down switching technique reduces the combination delay between the comparator output and DAC switches, the sampling speed is still limited by the DAC feedback loop. Moreover, in single-comparator architectures the decisions need more buffering as they have to propagate to multiple memory cells, resulting in increased power dissipation and further delay.

Figure 1:
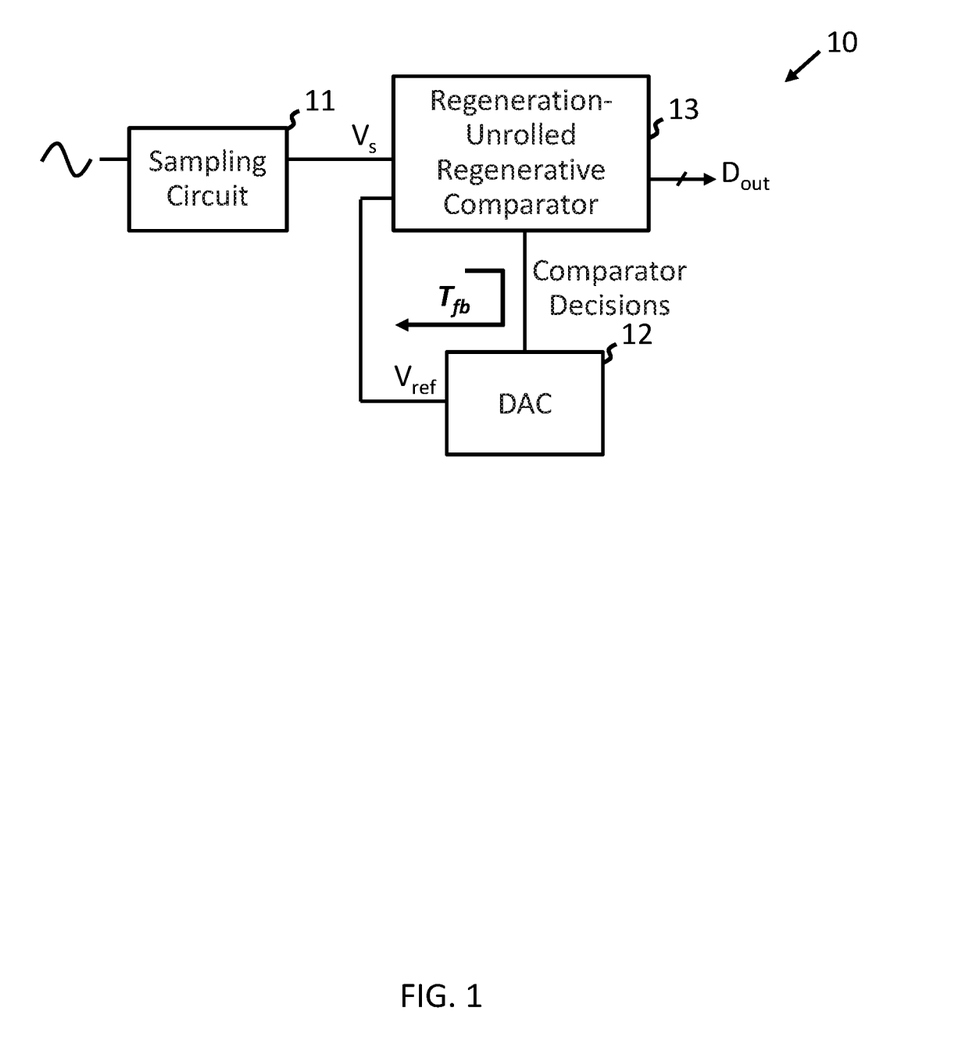
FIG. 1 is a schematic block diagram of an unrolled SAR ADC, consistent with several embodiments of the present disclosure.

FIG. 1 is a schematic block diagram of an unrolled SAR ADC 10, consistent with several embodiments of the present disclosure. This SAR ADC 10 comprises a sampling circuit 11, a DAC 12 and a regenerative comparator 13. This regenerative comparator 13 has an integration circuit and a plurality of regeneration circuits, described further below, and is referred to herein as a regeneration-unrolled comparator (RUC). Sampling circuit 11 samples the analog input signal to acquire a sampled voltage $V_s$. The RUC 13 operates as detailed below to compare the sampled voltage $V_s$ with a succession of reference voltages $V_{ref}$ to generate, for each reference voltage, a decision bit indicating the comparison result. DAC 12 generates the succession of reference voltages $V_{ref}$, in dependence on successive comparison results in RUC 13, to progressively approximate the sampled voltage via the binary search process explained above. During this operation, the integration circuit of RUC 13 generates output signals defining the aforementioned decision bits for successive steps of the comparison process. The regeneration circuits of RUC 13 receive the output signals from the integration circuit. These regeneration circuits are operable, in response to respective control signals, to store respective decision bits defined by successive output signals from the integration circuit. The resulting set of stored decision bits provides the SAR ADC output $D_{out}$.

Figure 2:
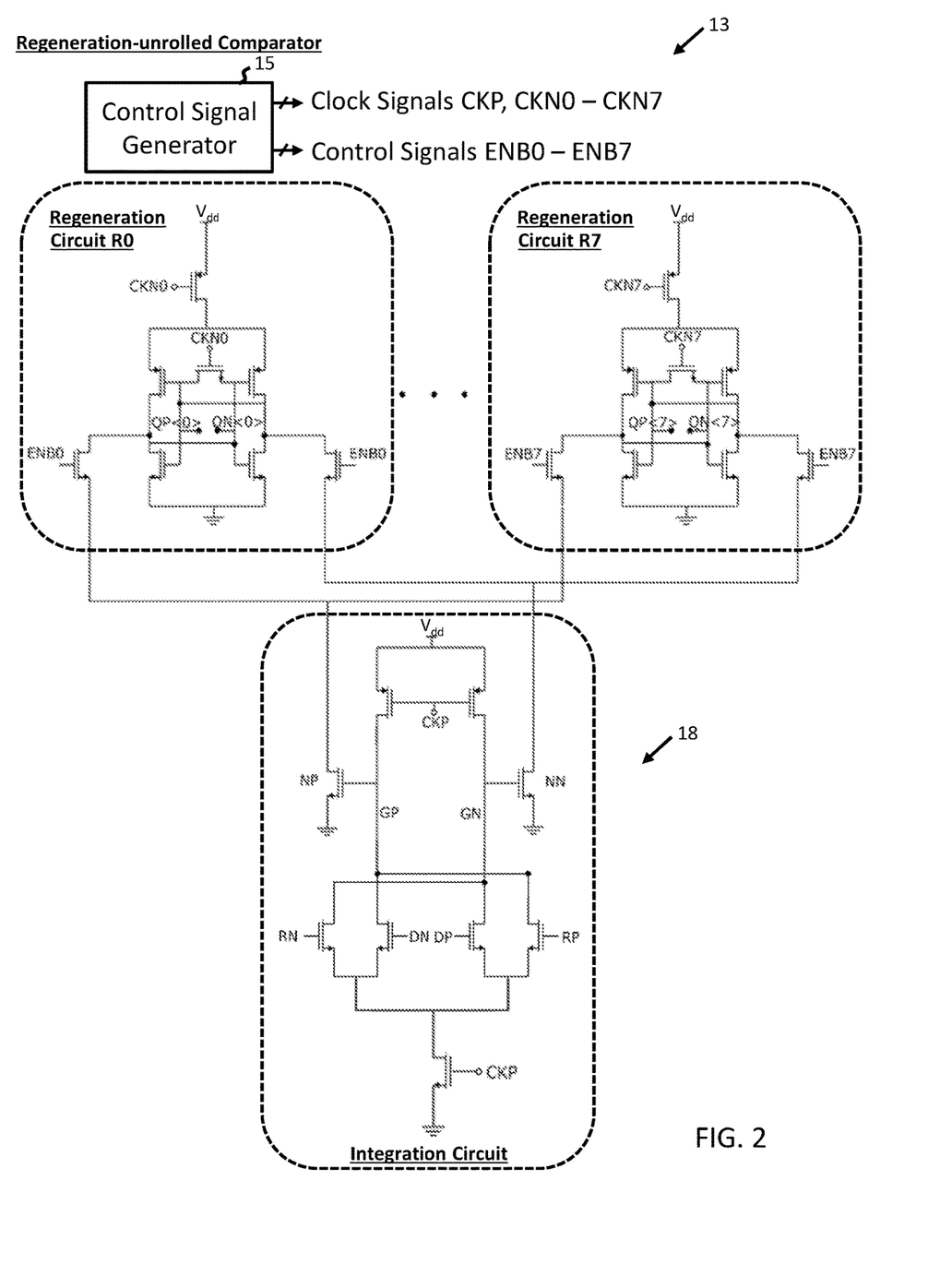
FIG. 2 shows a circuit diagram for an unrolled regenerative comparator, consistent with several embodiments of the present disclosure.

FIG. 2 shows a circuit diagram for a regeneration-unrolled comparator 13, consistent with several embodiments of the present disclosure. This design is based on double-tail regenerative comparators. However, while RUC 13 has a single integration circuit, RUC 13 also includes a plurality n of regeneration circuits, where n depends on the precision of the SAR ADC. In this example, there are 8 regeneration circuits, R0 to R7, for an 8-bit SAR ADC 10. In addition, integration circuit 18 includes additional transistors NP and NN which convert the differential output voltage GP/GN of the preamplifier to a differential current. This differential current output signal is steered to one of the regeneration circuits R0 to R7 as explained below.

Operation of RUC 13 is controlled by clock signals (CKP and CKN0 to CKN7) and control signals (ENB0 to ENB7) which may be generated by a control signal generator 15. When CKP is applied for successive steps i=0 to 7 of the comparison operation, integration circuit 18 generates a differential output current indicating the comparison result. This output signal is steered to one of the regeneration circuits R0 to R7 by the control signals ENB0 to ENB7. In the first decision step i=0, ENB0 is asserted at the cascade transistors of regeneration circuit R0, connecting R0 to the integration circuit. CKN0 is also asserted which enables the regeneration. One of the outputs (e.g., either QP<0> or QN<0>) then regenerates to $V_{dd}$, the other decreasing to ground, depending on the comparison result. When the regeneration is complete, ENB0 goes down to disconnect R0 from integration circuit 18, while CKN0 remains asserted. The regeneration circuit R0 thus stores the first comparator decision, decision bit do being defined by the state of differential output QP<0>, QN<0> of this circuit. For subsequent decisions steps i=1 to 7, integration circuit 18's output is steered to successive regeneration circuits R1 to R7 in response to assertion of successive control signals EBN1 to EBN7. These circuits are enabled by successive clock signals CKN1 to CKN7, whereby subsequent decision bits $d_1$ to $d_7$ are stored in respective circuits R1 to R7. When the final decision step is completed, the decision bits do to $d_7$ stored in R0 to R7 provide the output $D_{out}$ of the SAR ADC 10.

By storing the comparator decisions as described above, RUC 13 eliminates the need for the memory cells and logic between the comparator and the DAC in SAR ADC 10. The DAC 12 can be controlled directly based on comparison results in RUC 13. Advantageously, the DAC is arranged to receive the decision bits $d_1$ to $d_7$ stored by regeneration circuits R0 to R7. The DAC switches can thus be controlled directly by the decision bits, reducing buffering requirements. Eliminating the SAR logic between the comparator and DAC significantly reduces the feedback loop delay $T_{fb}$, offering enhanced sampling speeds. In SAR ADC 10, the feedback delay $T_{fb}$ can be approximated as $T_{fb}=T_{ckq}+T_{dac}$, offering a substantial increase in sampling speed. SAR ADC 10 also provides a highly compact design with only a single critical analog block, namely RUC 13.

In the design depicted in FIG. 2, the additional gain circuit introduced by NN and NP alleviates any potential offset due to mismatch of regeneration circuits R0 to R7. This can be further alleviated, if necessary, by simply adjusting the gain of the comparator. The higher sampling speed offered by SAR ADC 10 may be further improved by known speed-enhancement techniques referenced above. For example, an asynchronous implementation enables fine-tuning of the clock generation loop to accommodate different settling times for different decisions.

Figure 3:
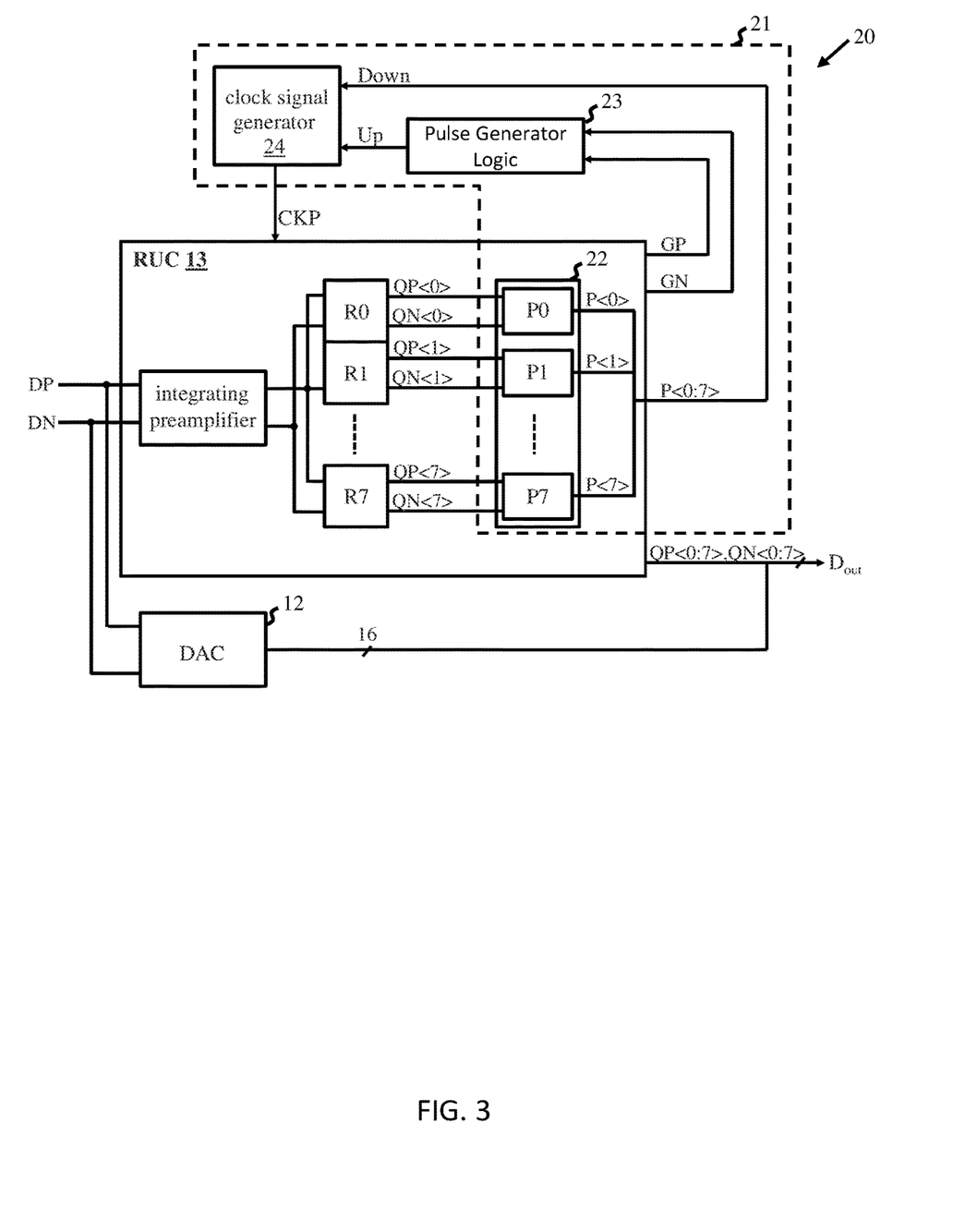
FIG. 3 is a schematic block diagram of an asynchronous SAR ADC, consistent with several embodiments of the present disclosure.

FIG. 3 is a schematic block diagram of an asynchronous SAR ADC 20 employing RUC 13. SAR ADC 20 includes clock generation logic, indicated generally at 21, for generating the clock signal CKP to initiate alternating comparison and reset operations of the comparator. The clock generation logic 21 is responsive to storage of successive decision bits by the regeneration circuits R0 to R7 to initiate successive reset operations of the comparator. In the design shown, clock generation logic 21 comprises a first pulse generator 22, a second pulse generator 23 and a clock signal generator 24. The first pulse generator 22 comprises component pulse generators P0 to P7 each of which is connected to a respective regeneration circuit R0 to R7 for generating a pulse in response to storage of a decision bit by that regeneration circuit. Pulse generator logic 23 is connected to integration circuit 18 of RUC 13 and receives the differential output signal GP, GN from this circuit. Pulse generator logic 23 can generate a pulse in response to reset of the output signal GP, GN after each comparison step. The clock signal generator 24 is connected to pulse generators 22, 23 and controls transitions in the clock signal CKP in response to pulses from the pulse generators. When a regeneration circuit R0 to R7 has stored a decision bit, a pulse P<0> to P<7> from pulse generator 22 causes clock generator 24 to pull CKP down, initiating a reset operation. When GP/GN then go high indicating that reset is complete, a pulse from pulse generator 23 causes clock generator 24 to pull CKP up, initiating another comparison. This variable clock timing thus allows just enough time for each decision step to be completed.

In SAR ADCs consistent with the present disclosure, offset compensation is required only in the integration circuit. This contrasts with prior designs using multiple comparators where each comparator needs to be calibrated.

Figure 4:
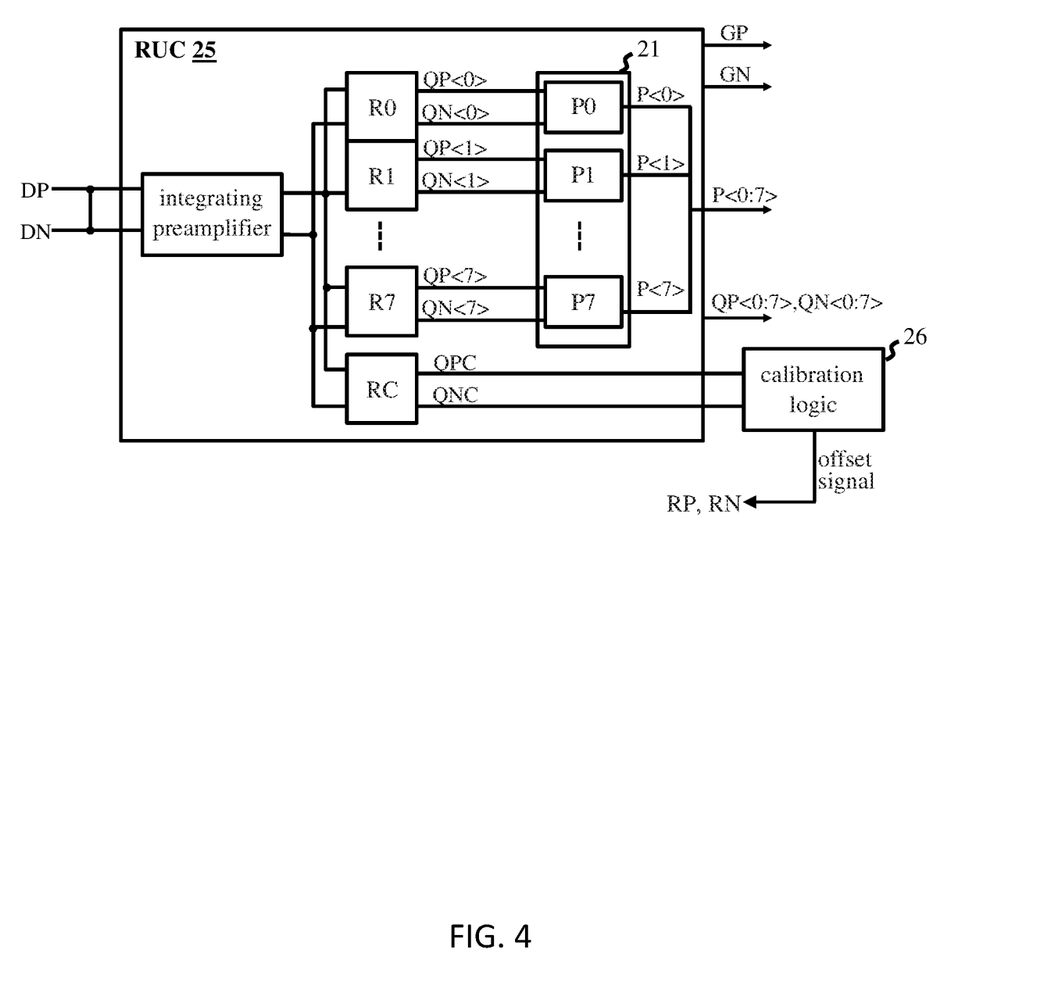
FIG. 4 is a schematic block diagram of a further embodiment of a regenerative comparator for SAR ADCs with a dynamic offset compensation mechanism, consistent with several embodiments of the present disclosure.

FIG. 4 is a schematic block diagram of a further embodiment of a regenerative comparator for SAR ADCs with a dynamic offset compensation mechanism. With this RUC 25, the SAR ADC 10 is operable in a conversion mode and a calibration mode. In the conversion mode, the SAR ADC performs analog-to-digital conversion of a sampled input voltage as described above. In the calibration mode, the inputs to RUC 25 are shorted as illustrated in FIG. 4. RUC 25 corresponds generally to the RUC 13 of FIG. 3, but includes a further regeneration circuit RC. This regeneration circuit RC is enabled (by control and clock signals generally as described for the other regeneration circuits) to receive the output signal from the integration circuit in the calibration mode and to store a further decision bit defined by this output signal. The resulting decision bit, defined by outputs QPC, QNC of RC, is supplied to calibration logic 26. This calibration logic can be implemented in known manner to calculate a comparator offset from the decision bits stored by RC over multiple calibration cycles. In particular, the decision bits stored by RC should be 1 or 0 with equal probability for zero comparator offset. Any skew in this probability distribution can be corrected by applying a differential voltage to inputs RP, RN of the integration circuit. For example, if the DP input transistor is stronger due to non-idealities in the circuit, RP will be greater than RN such that both sides are balanced. The comparator offset can be calculated periodically by calibration logic 26, e.g., after successive conversion operations or multiple conversion operations. An appropriate offset signal is then applied to inputs RP, RN to cancel the comparator offset.

The RUC-based SAR ADCs described offer highly efficient designs with reduced feedback delay and significantly enhanced sampling speeds. These SAR ADCs do not increase the number of critical analog blocks or the design overhead, and do not involve any significant increase in area, power consumption or hardware complexity. Initial results show that higher conversion speeds are achievable with similar power figures and area. Comparison of RUC SAR ADCs and SAR ADCs using conventional regenerative comparators show similar DAC settling times in the two architectures. However, simulated delays from the comparator decisions to the DAC inputs were 16.5 to 19 ps (depending on the bit) for the conventional architecture. With the RUC architecture, these delays were reduced to 6.6 to 9 ps (depending on the bit).

Sampling speeds of a conventional comparator asynchronous SAR ADC, and current consumptions at 1.25 GHz sampling speed, are shown in the table of FIG. 8a. The notably improved results with the RUC SAR ADC are given in FIG. 8b. Note also that these numbers just indicate the initial design point. Higher sampling speeds will be achievable in other designs since the DAC loop is much faster with the RUC than in the standard SAR ADC topology. If power dissipation is kept the same, RUC SAR ADCs are also expected to have lower noise due to the higher integrator gain.

Figure 5:
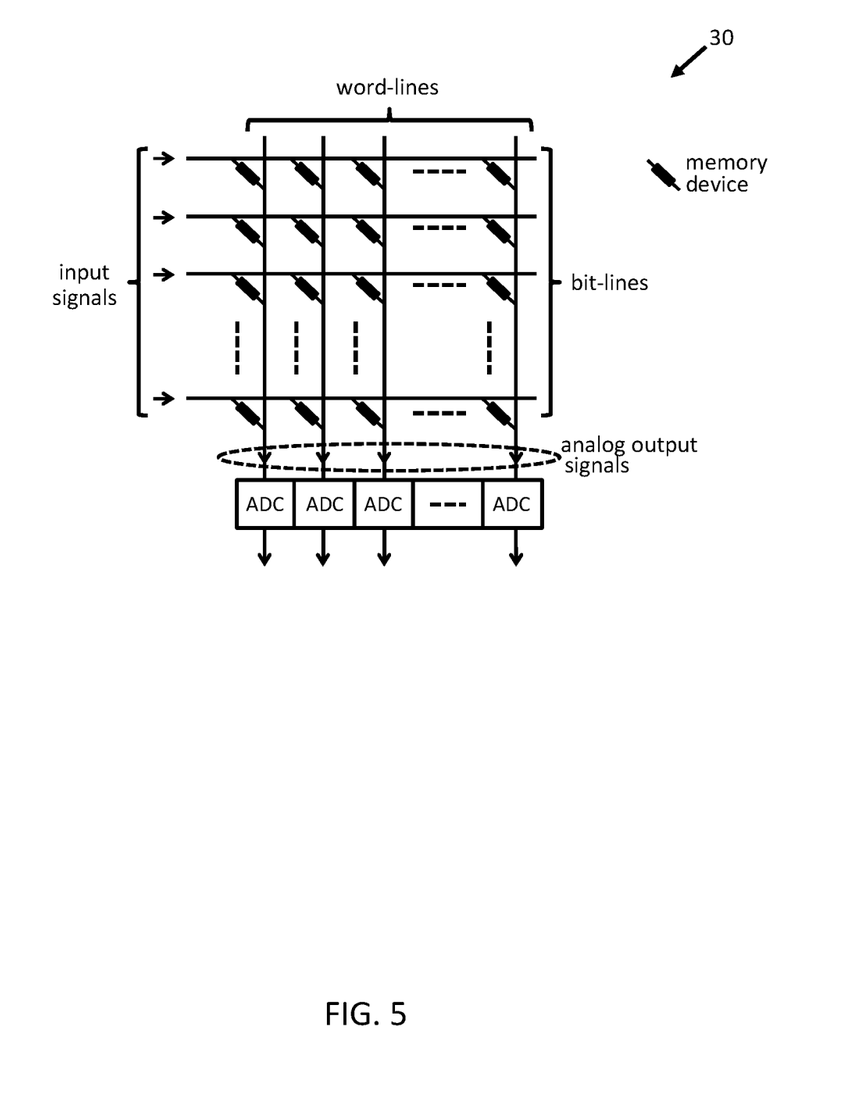
FIG. 5 is a schematic illustration of in-memory compute apparatus, consistent with several embodiments of the present disclosure.

RUC-based SAR ADCs offer enhanced operation in numerous applications, including data acquisition systems such as I/O link receivers, and various systems where large numbers of sensor outputs need to be digitalized, e.g., for biomedical applications. SAR ADCs consistent with the present disclosure also have important potential in so-called "in-memory" compute architectures. In-memory computing refers to techniques for performing certain computational tasks in situ in computational memory units employing arrays of memory devices. The basic architecture of an in-memory compute apparatus is illustrated schematically in FIG. 5. The apparatus 30 comprises an array of memory devices which are connected between respective pairs of word- and bit-lines of the array. These memory devices store values for a computation in which input signals are supplied to the bit-lines of the array to obtain analog output signals, providing the computation result, on the word-lines. Each word-line is connected to an ADC for converting the analog output signal on that word-line to a digital signal for further processing. Dense crossbar arrays of these memory devices provide massively-parallel and highly area- and energy-efficient compute architectures, offering a solution to the so-called "Von-Neumann bottleneck" which limits conventional computing systems. In-memory computation is particularly advantageous for highly compute-intensive applications, such as neural networks and AI (Artificial Intelligence) applications generally. In-memory compute architectures for these applications require a huge number of ADCs. These ADCs should not compromise the speed advantage of in-memory-computing, and should not dominate the operation in terms of power consumption. Using RUC-based SAR ADCs in these systems provides a promising solution, without latency, offering power efficiency and the possibility to be integrated in large numbers for both parallel and time-interleaved applications.

Figure 6:
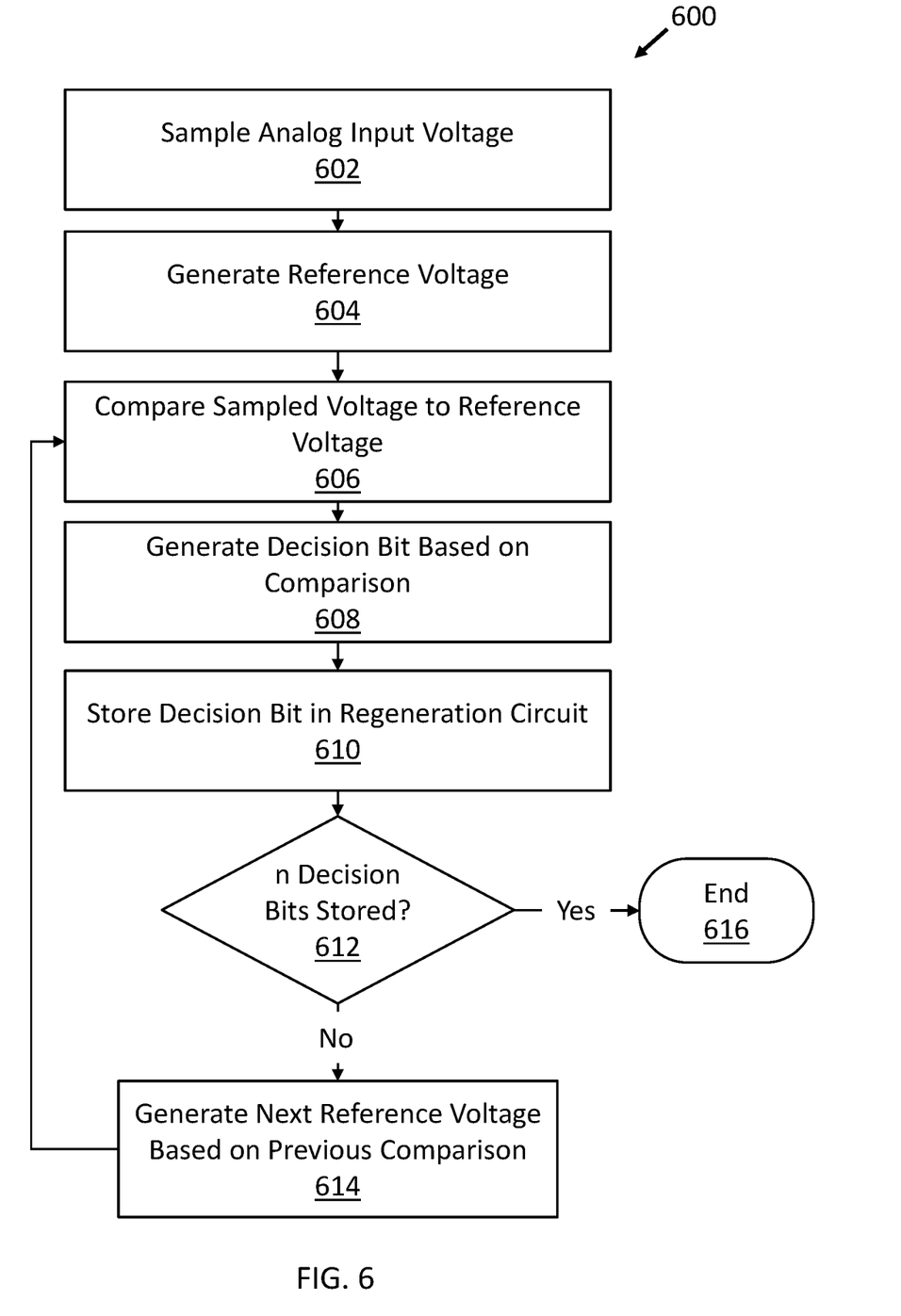
FIG. 6 is a high-level analog-to-digital conversion method, consistent with several embodiments of the present disclosure.

FIG. 6 is a high-level analog-to-digital conversion method 600, consistent with several embodiments of the present disclosure. Method 600 comprises acquiring an analog input voltage at operation 602. Operation 602 may include, for example, sampling an analog input via a sampling circuit such as, for example, sampling circuit 11. Method 600 further comprises generating a reference voltage at operation 604. Operation 604 may be performed by, for example, a Digital-to-Analog Converter (DAC) such as DAC 12. In some instances, an initial reference voltage may be based on some internal DAC voltage VDAC.

Method 600 further comprises comparing the sampled voltage to the reference voltage at operation 606. Operation 606 may be performed by a regenerative comparator, such as regenerative comparator 13.

Method 600 further comprises generating, at operation 608, a decision bit based on the comparison. Operation 608 may be performed by, for example, an integration circuit of a regenerative comparator, such as integration circuit 18. The decision bit may be represented by a differential current output from the integration circuit.

Method 600 further comprises storing the decision bit in a regeneration circuit at operation 610. Operation 610 may include, for example, steering the current output from the integration circuit to a regeneration circuit. Operation 610 may be performed via a control signal such as, for example, one of ENB0-ENB7. Depending upon the value of the decision bit, one of two outputs of the regeneration circuit may go to zero (while the other may regenerate), resulting in the decision bit being stored in the regeneration circuit.

Method 600 further comprises iterating through n regeneration circuits for n decision bits. Thus, method 600 further comprises determining whether n decision bits have been stored at decision 612. For example, a regenerative comparator having 8 regeneration circuits may store n=8 decision bits (one decision bit in each regeneration circuit). Once the desired number of decision bits have been stored (612 "Yes"), method 600 can end at 616.

If more decision bits have yet to be generated/stored (612 "No"), method 600 proceeds to generate a next reference voltage based on the preceding comparison at operation 614. Operation 614 may include, for example, generating a higher reference voltage if the previous reference voltage was below the sample voltage (as determined at operation 606). On the other hand, if the previous reference voltage was determined (at operation 606) to be above the sample voltage, operation 614 may include generating a lower reference voltage.

With a next reference voltage, method 600 can loop back to compare the next reference voltage to the (same) sampled voltage at operation 606, and proceed through operations 608-612 again. This way, method 600 can result in approximating an analog voltage and storing results (i.e., decision bits) in regeneration circuits.

It will be appreciated that numerous alternatives and modifications can be made to the particular embodiments described above. By way of example, the integration and regeneration circuits of SAR ADCs consistent with the present disclosure can be implemented using various other circuit designs as will be apparent to those skilled in the art. Other clock generation and timing control circuits can also be envisaged.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A successive-approximation analog-to-digital converter comprising a regenerative comparator configured to generate a set of decision bits, wherein the regenerative comparator includes:
   an integration circuit configured to generate output signals defining each decision bit of the set of decision bits; and
   a plurality of regeneration circuits, the regeneration circuits configured to:
      receive the output signals;
      receive control signals; and
      responsive to the control signals, store the decision bits defined by the output signals from the integration circuit.

2. The analog-to-digital converter of claim 1, further comprising a sampling circuit configured to sample an analog input signal to acquire a sampled voltage.

3. The analog-to-digital converter of claim 2, wherein the regenerative comparator is further configured to compare the sampled voltage with a succession of reference voltages.

4. The analog-to-digital converter of claim 2, further comprising a digital-to-analog converter configured to generate a succession of reference voltages to progressively approximate the sampled voltage, the succession of reference voltages including at least a next reference voltage, wherein the generating the next reference voltage is based on a previous comparison result from the regenerative comparator.

5. The analog-to-digital converter of claim 1, wherein the generated set of decision bits comprises a decision bit for each reference voltage.

6. The analog-to-digital converter of claim 1, further comprising clock generation logic configured to:
generate a clock signal;
modify the clock signal between an up state and a down state, wherein the modifying is based on storage of the set of decision bits by the regeneration circuits; and
alternate, via the clock signal, comparison and reset operations of the comparator, wherein the alternating is based on whether the clock signal is in the up state or the down state.

7. The analog-to-digital converter of claim 1, wherein the comparator includes n regeneration circuits and each regeneration circuit of the n regeneration circuits is configured to store a corresponding decision bit.

8. The analog-to-digital converter of claim 1, wherein the integration circuit comprises an integrating preamplifier.

9. The analog-to-digital converter of claim 8, wherein the integrating preamplifier comprises a double-tail topology.

10. The analog-to-digital converter of claim 1, further comprising a control signal generator for generating the control signals.

11. An in-memory compute apparatus comprising an array of memory devices, connected between respective pairs of word- and bit-lines of the array, for storing values for a computation in which input signals are supplied to the bit-lines to obtain analog output signals on the word-lines, wherein each word-line is connected to an analog-to-digital converter for analog-to-digital conversion of an output signal on that word-line, the analog-to-digital converter comprising:
a regenerative comparator configured to generate a set of decision bits, wherein the regenerative comparator comprises:
an integration circuit configured to generate output signals defining each decision bit of the set of decision bits; and
a plurality of regeneration circuits, the regeneration circuits configured to:
receive the output signals;
receive control signals; and
responsive to the control signals, store the decision bits defined by the output signals from the integration circuit.

12. A method comprising:
generating, via an integration circuit included in a regenerative comparator, output signals defining each decision bit of a set of decision bits;
receiving, via a plurality of regeneration circuits, the output signals;
receiving, via the plurality of regeneration circuits, control signals; and
storing, in response to the control signals and via the plurality of regeneration circuits, the decision bits defined by the output signals from the integration circuit.

13. The method of claim 12, further comprising sampling, via a sampling circuit, an analog input signal.

14. The method of claim 13, further comprising acquiring, based on the sampling, a sampled voltage.

15. The method of claim 12, further comprising acquiring comparing, via a regenerative comparator, a sampled voltage with a succession of reference voltages, wherein the regenerative comparator includes an integration circuit and a plurality of regeneration circuits.

16. The method of claim 15, further comprising generating, via the regenerative comparator and for each reference voltage of the succession of reference voltages, a decision bit based on the comparing, the decision bit included in a set of decision bits.

17. The method of claim 15, further comprising generating, via a digital-to-analog converter, the succession of reference voltages to progressively approximate the sampled voltage, wherein generating the succession of reference voltages comprises generating a next reference voltage, wherein the generating the next reference voltage is based on a previous comparison result from the regenerative comparator.

18. The method of claim 17, further comprising:
receiving, via the digital-to-analog converter, the set of decision bits stored by the regeneration circuits; and
controlling, via the digital-to-analog converter and based on the set of decision bits, generation of the reference voltages.

19. The method of claim 12, further comprising:
generating, via clock generation logic, a clock signal;
modifying, via the clock generation logic, the clock signal between an up state and a down state, wherein the modifying is based on storage of the set of decision bits by the plurality of regeneration circuits; and
alternating comparison and reset operations of the comparator based on whether the clock signal is in the up state or the down state.

20. The method of claim 12, further comprising generating, via a control signal generator, the control signals.

* * * * *